(12) United States Patent
Torii

(10) Patent No.: US 12,198,912 B2
(45) Date of Patent: Jan. 14, 2025

(54) TARGET AND FILM FORMING APPARATUS

(71) Applicant: JSW AFTY Corporation, Tokyo (JP)

(72) Inventor: Hironori Torii, Tokyo (JP)

(73) Assignee: JSW AFTY CORPORATION, Tokyo (JP)

( * ) Notice: Subject to any disclaimer, the term of this patent is extended or adjusted under 35 U.S.C. 154(b) by 0 days.

(21) Appl. No.: 18/044,887

(22) PCT Filed: Jul. 6, 2021

(86) PCT No.: PCT/JP2021/025512
§ 371 (c)(1),
(2) Date: Mar. 10, 2023

(87) PCT Pub. No.: WO2022/064810
PCT Pub. Date: Mar. 31, 2022

(65) Prior Publication Data
US 2023/0369034 A1    Nov. 16, 2023

(30) Foreign Application Priority Data

Sep. 25, 2020  (JP) .................................. 2020-160577

(51) Int. Cl.
*H01J 37/34* (2006.01)
*C23C 14/04* (2006.01)
*C23C 14/34* (2006.01)

(52) U.S. Cl.
CPC ........ *H01J 37/3441* (2013.01); *C23C 14/042* (2013.01); *C23C 14/34* (2013.01); *H01J 37/3423* (2013.01); *H01J 2237/332* (2013.01)

(58) Field of Classification Search
CPC ............... H01J 37/3441; H01J 37/3423; H01J 37/3435; H01J 37/32477; H01J 37/3417;
(Continued)

(56) References Cited

U.S. PATENT DOCUMENTS

| 4,492,620 A | 1/1985 | Matsuo et al. |
| 2018/0171464 A1 | 6/2018 | Iwata et al. |
| 2022/0102124 A1 | 3/2022 | Torii et al. |

FOREIGN PATENT DOCUMENTS

| JP | 659-47728 A | 3/1984 |
| JP | s60-50167 | * 3/1985 |

(Continued)

OTHER PUBLICATIONS

Machine Translation JPS6050167 (Year: 1985).*

(Continued)

*Primary Examiner* — Rodney G McDonald
(74) *Attorney, Agent, or Firm* — McCormick, Paulding & Huber PLLC

(57) ABSTRACT

A film forming apparatus 1 includes a target TA, a ring-shaped shield member 30 provided between the target TA and a plasma generation unit, and a ring-shaped shield member 40 provided between the target TA and a workpiece holding unit. The target TA includes a cylindrical target member 21 and a backing tube (supporting member) 20 configured to support the target member 21. Each of the shield member 30, the shield member 40, and the target member 21 is stacked in a Z direction around an axis VL1 as a central axis extending in the Z direction, each of the shield member 30, the target member 21, and the shield member 40 is arranged so as to be separated from each other in the Z direction, and an inner diameter D1 of the shield member 30 is smaller than an inner diameter D2 of the target member 21.

7 Claims, 9 Drawing Sheets

(58) Field of Classification Search
CPC ............... H01J 37/3447; H01J 37/3414; H01J 2237/332; C23C 14/042; C23C 14/34; C23C 14/357; C23C 14/564; C23C 14/3407; C23C 14/50
See application file for complete search history.

(56) References Cited

FOREIGN PATENT DOCUMENTS

| | | | |
|---|---|---|---|
| JP | 01-036693 | * | 8/1989 |
| JP | H07-221021 A | | 8/1995 |
| JP | 2005-171328 A | | 6/2005 |
| JP | 2018-111886 A | | 7/2018 |
| JP | 2020-122178 A | | 8/2020 |

OTHER PUBLICATIONS

Machine Translation JP01-036693 (Year: 1989).*
International Search Report mailed on Aug. 31, 2021, in connection with corresponding International Application No. PCT/JP2021/025512 (5pp., including machine-generated English translation).

* cited by examiner

TARGET AND FILM FORMING APPARATUS

CROSS-REFERENCE TO RELATED APPLICATIONS

This application is a National Stage application of International Patent Application No. PCT/JP2021/025512, filed on Jul. 6, 2021, which claims priority to Japanese Patent Application No. 2020-160577, filed on Sep. 25, 2020, each of which is hereby incorporated by reference in its entirety.

TECHNICAL FIELD

The present invention relates to a target, a film forming apparatus, and a manufacturing technology for a film formation object, and relates to, for example, a technology for forming a film on a film formation object by the use of plasma.

BACKGROUND

Japanese Unexamined Patent Application Publication No. S59-47728 (Patent Document 1) describes a technology for forming a film on a film formation object by depositing, to the film formation object, target particles ejected from a target member by making ions contained in the plasma generated by using the electron cyclotron resonance (ECR) phenomenon collide with the target member.
Patent Document 1: Japanese Unexamined Patent Application Publication No. S59-47728

SUMMARY

Problems to be Solved by the Invention

In the sputtering technology, a film is formed on a film formation object by depositing, to the film formation object, target particles ejected from a target member by making ions contained in the plasma collide with the target member. Shield members for preventing the plasma from being applied to a supporting member that supports the target member are arranged above and below the target member. The shield members are arranged so as to be separated from the target member in order to suppress the short-circuit with the target member. However, it has been found that when deposits formed on the shield member grow by continuously performing the film forming process, the sputtering becomes unstable due to the deposits.

Other problems and novel features will be apparent from the description of this specification and the accompanying drawings.

Means for Solving the Problems

A film forming apparatus according to an embodiment includes a workpiece holding unit configured to hold a film formation object, a plasma generation unit configured to generate plasma, a target provided between the workpiece holding unit and the plasma generation unit, a ring-shaped first shield member provided between the target and the plasma generation unit, and a ring-shaped second shield member provided between the target and the workpiece holding unit. The target includes a cylindrical target member and a supporting member arranged around the target member and configured to support the target member. Each of the first shield member, the second shield member, and the target member is stacked in a first direction around a first axis as a central axis extending in the first direction, each of the first shield member, the target member, and the second shield member is arranged so as to be separated from each other in the first direction, and an inner diameter of the first shield member is smaller than an inner diameter of the target member.

The inner diameter of the first shield member provided in the film forming apparatus according to another embodiment is smaller than an inner diameter of the second shield member.

The first shield member provided in the film forming apparatus according to another embodiment has a first portion overlapping the supporting member of the target in the first direction and a second portion not overlapping the target in the first direction. A thickness of the second portion is smaller than a thickness of the first portion. When a surface of the target member including a surface facing the first shield member is defined as a reference surface, a shortest distance from the second portion to the reference surface is larger than a shortest distance from the first portion to the reference surface.

In the film forming apparatus according to another embodiment, the first shield member has a stepped portion between the first portion and the second portion. A thickness of a portion outside the stepped portion is equal to the thickness of the first portion. A thickness of a portion inside the stepped portion is equal to the thickness of the second portion.

The stepped portion provided in the film forming apparatus according to another embodiment overlaps the target member in the first direction.

A surface of the second portion facing the target in the film forming apparatus according to another embodiment is an inclined surface inclined with respect to a second direction orthogonal to the first direction. The inner diameter of the first shield member is 90% or more of the inner diameter of the target member.

The inner diameter of the first shield member in the film forming apparatus according to another embodiment is 99% or less of the inner diameter of the target member.

Effects of the Invention

According to one embodiment, it is possible to stabilize the sputtering even when deposits are formed on the shield member.

BRIEF DESCRIPTIONS OF THE DRAWINGS

DETAILED DESCRIPTION

Figure 1:
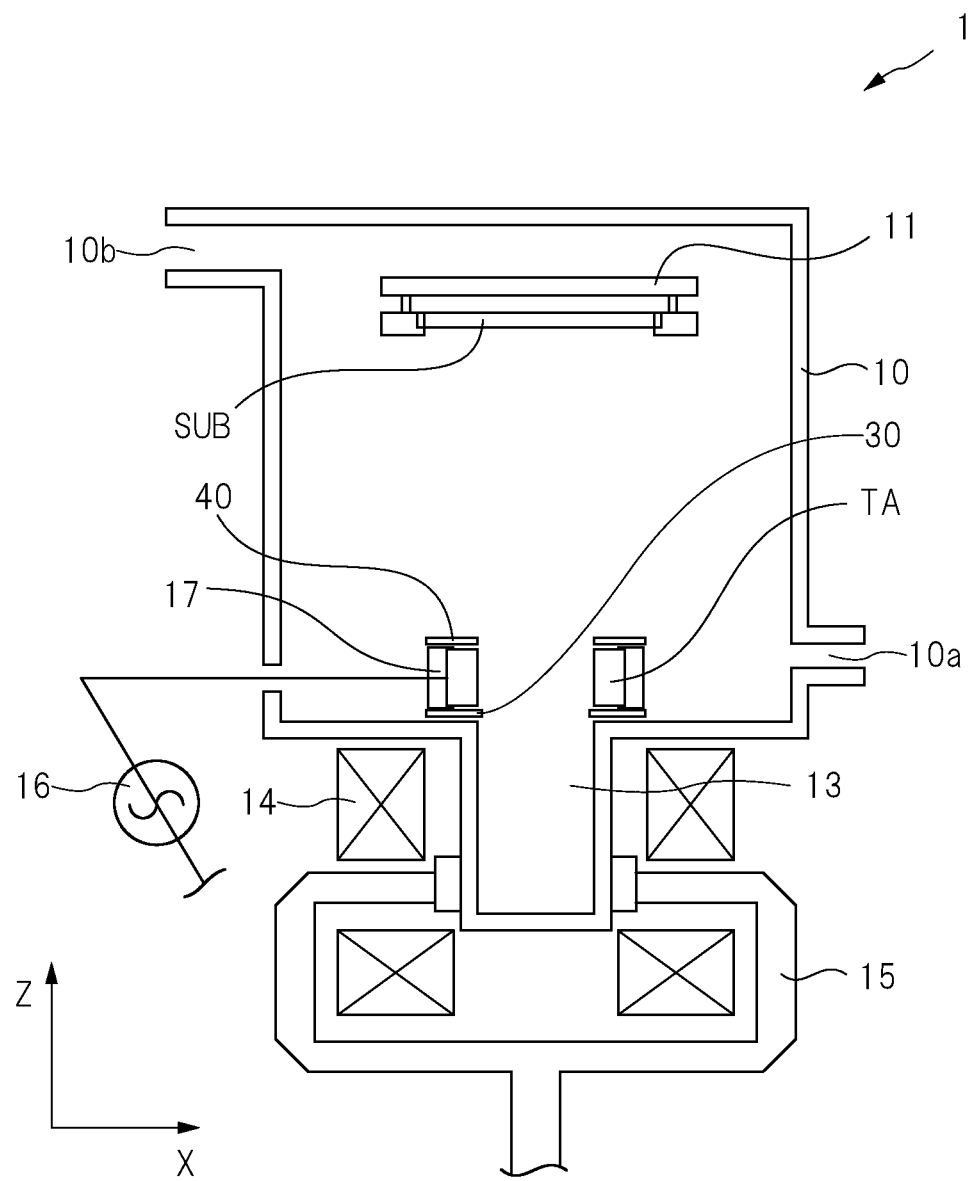
FIG. 1 is a diagram showing a schematic configuration of a film forming apparatus.

In all of the drawings for describing the embodiment, the same members are denoted by the same reference characters and repetitive descriptions thereof will be omitted in principle. Note that hatching may be applied even in a plan view in some cases in order to make the drawings easy to see.

<Configuration of Film Forming Apparatus>

FIG. 1 is a diagram showing a schematic configuration of a film forming apparatus. In FIG. 1, a film forming apparatus 1 includes a chamber 10 which is a film forming chamber. In this chamber 10, a workpiece holding unit 11 is provided and a film formation object SUB typified by a substrate is held by this workpiece holding unit 11. This chamber 10 is provided with a gas introduction port 10a and a gas exhaustion port 10b.

Next, in the chamber 10, a plasma generation unit 13 is provided at a position facing the film formation object SUB held by the workpiece holding unit 11. The plasma generation unit 13 is configured to generate plasma, and a magnetic field generation unit 14 composed of, for example, a coil is arranged around the plasma generation unit 13. Also, a waveguide 15 is connected to the plasma generation unit 13, and microwaves propagating through the waveguide 15 are introduced into the plasma generation unit 13. Further, a target TA having a cylindrical shape or the like is arranged at a position between the workpiece holding unit 11 and the plasma generation unit 13 and close to the plasma generation unit 13, and the target TA is electrically connected to a power source 16 capable of supplying a high frequency power, a DC power, and a pulse power. Consequently, the target TA is configured such that the high frequency voltage from the power source 16 is applied. This target TA is fixed by a fixing unit 17.

Further, the film forming apparatus 1 includes a ring-shaped shield member (first shield member) 30 and a ring-shaped shield member (second shield member) 40. Assuming that the direction from the plasma generation unit 13 to the workpiece holding unit 11 is the Z direction, the shield member 30 is provided between the target TA and the plasma generation unit 13 in the Z direction. Also, the shield member 40 is provided between the target TA and the workpiece holding unit 11.

<Film Forming Method>

Figure 2:
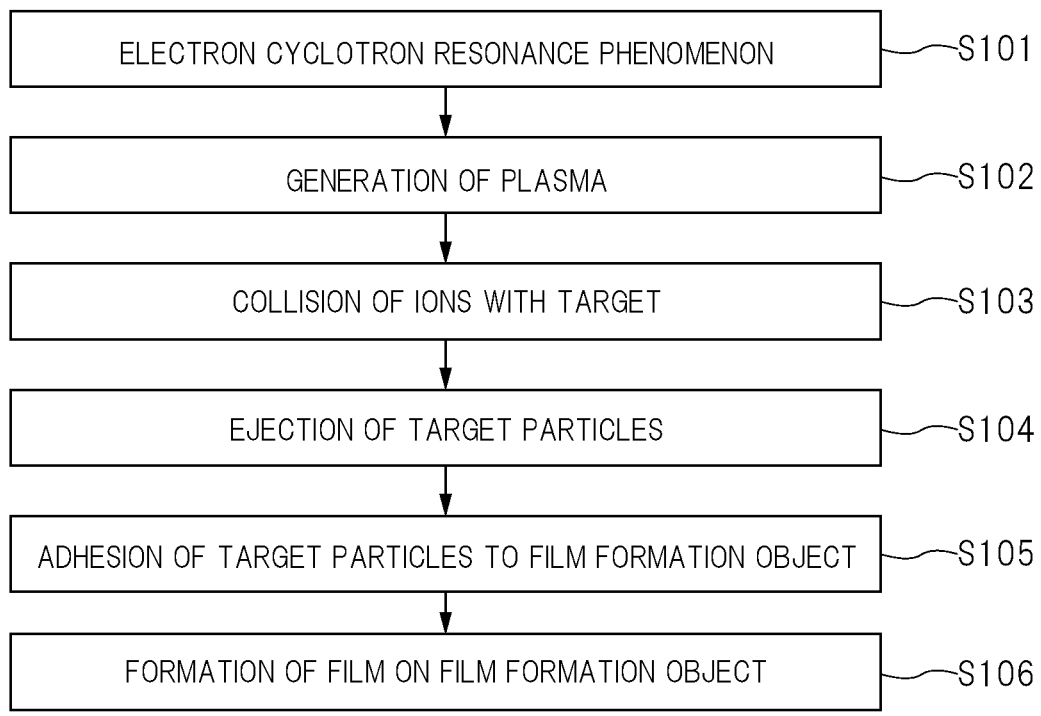
FIG. 2 is a flowchart showing each step of a film forming method performed using the film forming apparatus shown in FIG. 1.

Next, a film forming method using the film forming apparatus 1 will be described. FIG. 2 is a flowchart showing each step of a film forming method performed using the film forming apparatus shown in FIG. 1.

First, in FIG. 1, a gas typified by, for example, argon gas is introduced into the plasma generation unit 13. Then, when a magnetic field is generated from the magnetic field generation unit 14 arranged around the plasma generation unit 13, the electrons contained in the gas introduced into the plasma generation unit 13 receive a Lorentz force to make a circular motion. At this time, when microwaves (electromagnetic waves) having the same period (or frequency) as the period (or frequency) of the circular motion of the electrons are introduced from the waveguide 15 into the plasma generation unit 13, the electrons making the circular motion and the microwaves are resonated, so that the energy of the microwaves is efficiently supplied to the electrons making the circular motion (electron cyclotron resonance phenomenon) (step S101 in FIG. 2). As a result, the kinetic energy of the electrons contained in the gas increases, and the gas separates into positive ions and electrons. In this manner, a plasma composed of positive ions and electrons is generated (step S102 in FIG. 2).

Next, in FIG. 1, a high frequency voltage is supplied from the power source 16 to the target TA. In this case, the positive potential and the negative potential are alternately applied to the target TA to which the high frequency voltage is supplied. Here, of the positive ions and electrons constituting the plasma, the electrons having a light mass can follow the high frequency voltage applied to the target TA, while the positive ions having a heavy mass cannot follow the high frequency voltage. As a result, the positive potential that attracts the following electrons is canceled by the negative charge of the electrons, while the average value of the high frequency voltage shifts from 0 V to the negative potential because the negative potential remains. This means that it is possible to consider as if a negative potential is applied to the target TA, though a high frequency voltage is applied to the target TA. As a result, the positive ions are attracted to the target TA, which is considered to be applied with a negative potential on average, and collide with the target TA (step S103 in FIG. 2).

Subsequently, when the positive ions collide with the target TA, target particles constituting the target TA receive a part of the kinetic energy of the positive ions and are ejected from the target TA into the internal space of the chamber 10 (step S104 in FIG. 2). Thereafter, some of the target particles that have been ejected to the internal space of the chamber 10 adhere to the surface of the film formation object SUB held by the workpiece holding unit 11 (step S105 in FIG. 2). Then, by repeating such a phenomenon, a large number of target particles adhere to the surface of the film formation object SUB, so that a film is formed on the surface of the film formation object SUB (step S106 in FIG. 2).

For example, when the target TA is made of aluminum, the target particles are aluminum atoms, and the film formed on the film formation object SUB is an aluminum film. However, when the above-mentioned film forming operation is performed while introducing oxygen gas or nitrogen gas through the gas introduction port 10a provided in the chamber 10 of the film forming apparatus 1 shown in FIG. 1, an aluminum oxide film or an aluminum nitride film can be formed on the surface of the film formation object SUB.

Similarly, when the target TA is made of, for example, silicon, the target particles are silicon atoms, and the film formed on the film formation object SUB is a silicon film. However, when the above-mentioned film forming operation is performed while introducing oxygen gas or nitrogen gas through the gas introduction port 10a provided in the chamber 10 of the film forming apparatus 1 shown in FIG. 1, a silicon oxide film or a silicon nitride film can be formed on the surface of the film formation object SUB.

<Advantages of Film Forming Apparatus>

In the film forming apparatus 1 described above, the film formation object SUB is irradiated with a plasma flow generated by utilizing the electron cyclotron resonance (ECR) phenomenon and the divergent magnetic field, and a high frequency voltage is simultaneously applied between the target TA and the ground, whereby ions in the plasma are caused to collide with the target TA to form a film on the film formation object SUB. If this film forming method is called an ECR sputtering method, this ECR sputtering method has the following advantages.

For example, in the magnetron sputtering method, the order of $10^{-3}$ Torr ($10^{-3}\times133.32$ Pa) or more is necessary to obtain the stable plasma. On the other hand, in the ECR sputtering method, the stable ECR plasma can be obtained at a pressure on the order of $10^{-4}$ Torr ($10^{-4}\times133.32$ Pa). Further, in the ECR sputtering method, since the sputtering is performed by applying the particles (positive ions) in the plasma to the target TA by a high frequency voltage, a film can be formed on the film formation object SUB at a low pressure.

In the ECR sputtering method, the film formation object SUB is irradiated with the ECR plasma flow and the sputtered particles. Since the ions of the ECR plasma flow have an energy of 10 eV to several tens of eV and the pressure is low, the ion current density of the ions reaching the film formation object SUB can be increased. Therefore, the ions of the ECR plasma flow give energy to the raw material particles that are sputtered and fly onto the film formation object SUB, and promote the bonding reaction between the raw material particles and oxygen, so that the quality of the film deposited on the film formation object SUB by the ECR sputtering method is improved. In the ECR sputtering method mentioned above, it is particularly advantageous that a high-quality film can be formed on the film formation object at a low substrate temperature (temperature of the film formation object SUB).

From the above, the film forming apparatus 1 is superior in that it can form a high-quality film. In particular, it can be said that the film forming apparatus 1 is excellent in that a high-quality film can be formed on the surface of the film formation object without exposing the film formation object SUB to a high temperature. Namely, it can be said that the film forming apparatus 1 is excellent in that a high-quality film can be formed on the surface of the film formation object SUB while reducing the damage given to the film formation object SUB.

<Target>

Figure 3:
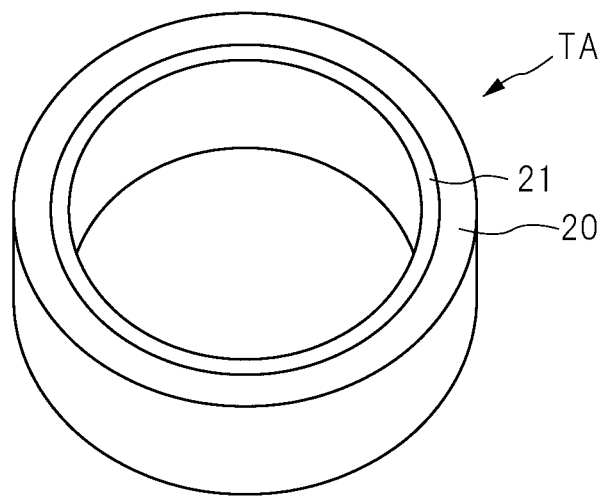
FIG. 3 is a perspective view showing an external configuration of a target used in the film forming apparatus in FIG. 1.

FIG. 3 is a perspective view showing an external configuration of the target used in the film forming apparatus in FIG. 1. As shown in FIG. 3, the target TA has a cylindrical shape. The target TA includes a cylindrical backing tube (supporting member) 20 made of, for example, a copper material, and a cylindrical target member 21 made of, for example, aluminum is adhered to an inner wall of the backing tube 20 by a bonding material (adhesive material) (not shown).

In the case of the film forming method using the cylindrical target TA configured in this way, it is possible to reduce the damage given to the film formation object SUB shown in FIG. 1 as compared with the case of using a generally used disk-shaped target. When forming a film by using the cylindrical target TA, the probability that the ions (for example, argon ions) that have recoiled after colliding with the target member 21 collide with the film formation object SUB is reduced in comparison with the case of forming a film by using a disk-shaped target. Therefore, in the film forming apparatus having the configuration in which the cylindrical target TA is used to form a film on the surface of the film formation object SUB, the probability that the recoiled argon ions collide with the film formation object SUB is reduced, so that it is possible to reduce the damage to the film formation object SUB due to the collision of the recoiled argon ions with the film formation object SUB.

<Shield Member>

Figure 4:
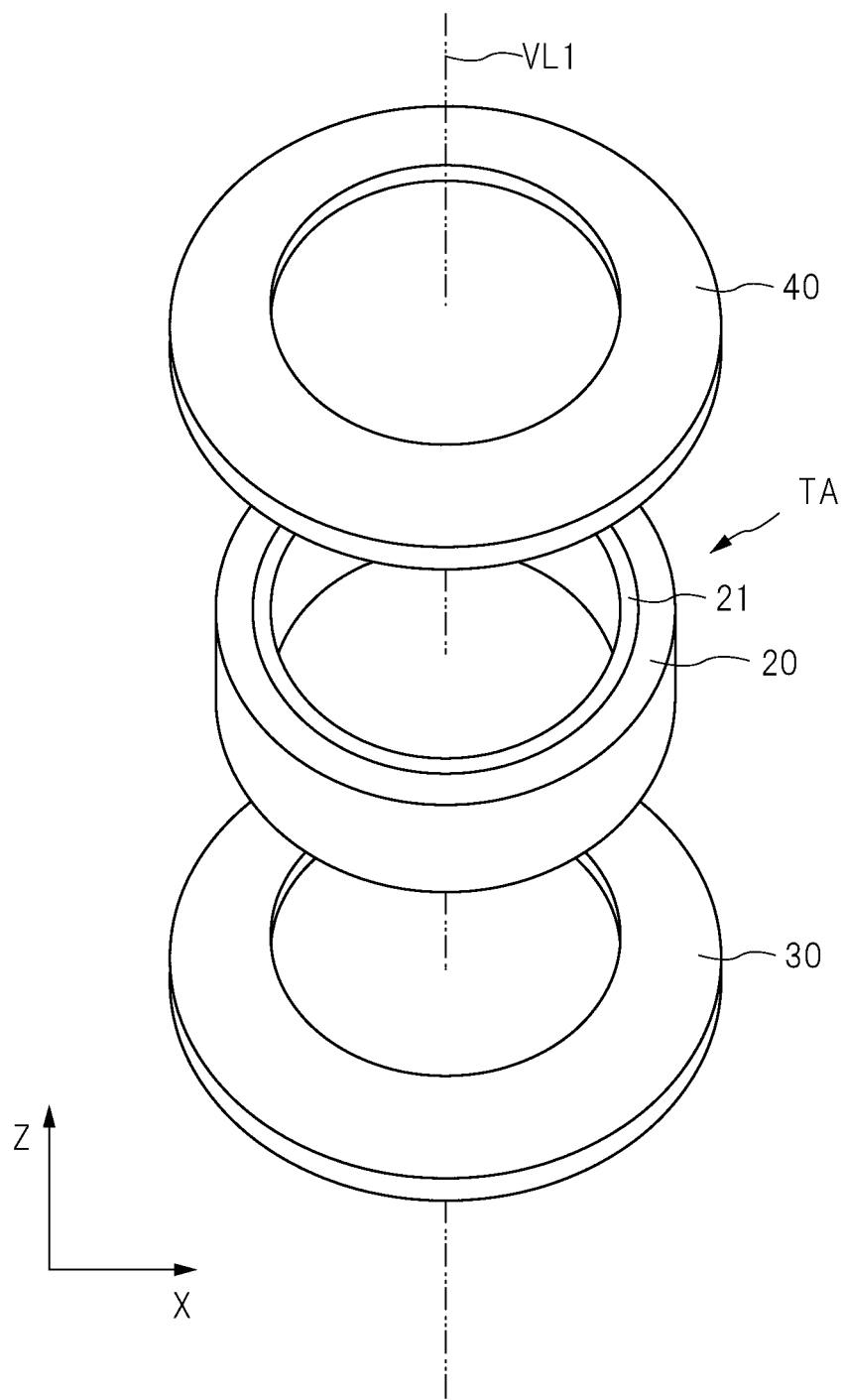
FIG. 4 is a perspective view showing an external configuration of shield members used in the film forming apparatus in FIG. 1.
Figure 5:
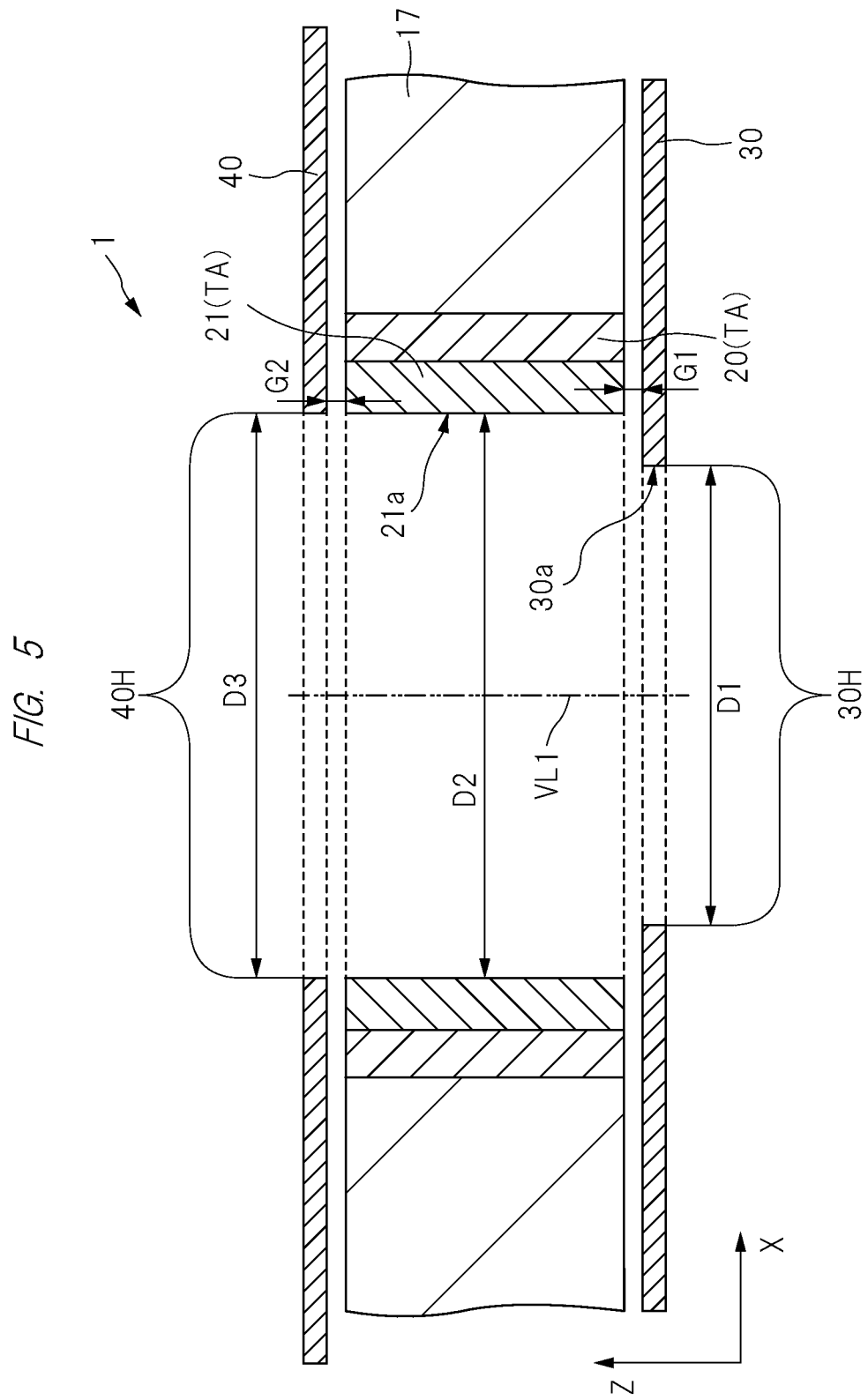
FIG. 5 is a cross-sectional view showing a positional relationship between the shield members and the target in the film forming apparatus.

FIG. 4 is a perspective view showing an external configuration of shield members used in the film forming apparatus in FIG. 1. FIG. 5 is a cross-sectional view showing a positional relationship between the shield members and the target in the film forming apparatus. As shown in FIG. 4, each of the shield member 30 and the shield member 40 has a ring shape.

As shown in FIG. 4 and FIG. 5, each of the shield member 30, the shield member 40, and the target member 21 is stacked in the Z direction around an axis (virtual line) VL1 as a central axis extending in the Z direction. More specifically, the shield member 30, the target member 21, and the shield member 40 are stacked in this order from the side of the plasma generation unit 13 (see FIG. 1) so as to be separated from each other.

The shield members 30 and 40 are protective members for suppressing the collision of the plasma with the backing tube 20 that holds the target member 21. By arranging the shield members 30 and 40 at positions overlapping the target member 21 in the Z direction, it is possible to reduce the occurrence frequency of the collision of the plasma with the backing tube 20 arranged outside the target member 21. As a result, it is possible to suppress the sputtering by the plasma to the backing tube 20.

Also, the shield members 30 and 40 are arranged so as to face each other with the target member 21 interposed therebetween in the Z direction. In this way, it is possible to suppress the high frequency voltage supplied to the target TA from diffusing around the target member 21. In other words, the shield members 30 and 40 function as diffusion preventing members for preventing the diffusion of the high frequency voltage supplied to the target TA.

From the viewpoint of effectively exerting the function as the protective member and the function as the diffusion preventing member, each of the shield members 30 and 40 is preferably made of a metal material. For example, stainless steel can be presented as the metal material forming the shield members 30 and 40. In order to prevent the short-circuit between the shield members 30 and 40 made of metal and the target member 21, each of the shield members 30 and 40 is arranged so as to be separated from target member 21. In other words, each of the shield members 30 and 40 is electrically isolated from the target member 21. However, if the separation distances between the target member 21 and each of the shield members 30 and 40 become extremely large, the probability that the plasma enters through the gaps between the target member 21 and each of the shield members 30 and 40 increases, and it is thus preferable that the separation distances are small. According to the studies by the inventor of this application, each of a separation distance G1 between the target member 21 and the shield member 30 and a separation distance G2 between the target member 21 and the shield member 40 is preferably 5 mm or less, and particularly preferably 3 mm or less. However, each of the separation distances G1 and G2 needs to be larger than 0 mm.

The plasma generated by the plasma generation unit 13 (see FIG. 1) passes through an opening 30H of the ring-shaped shield member 30 and collides with the target member 21. Therefore, it has been considered that an inner diameter D1 of the opening 30H of the shield member 30 is preferably the same as an inner diameter D2 of the cylindrical target member 21 in order for the plasma ions to efficiently collide with the target member 21.

Figure 6:
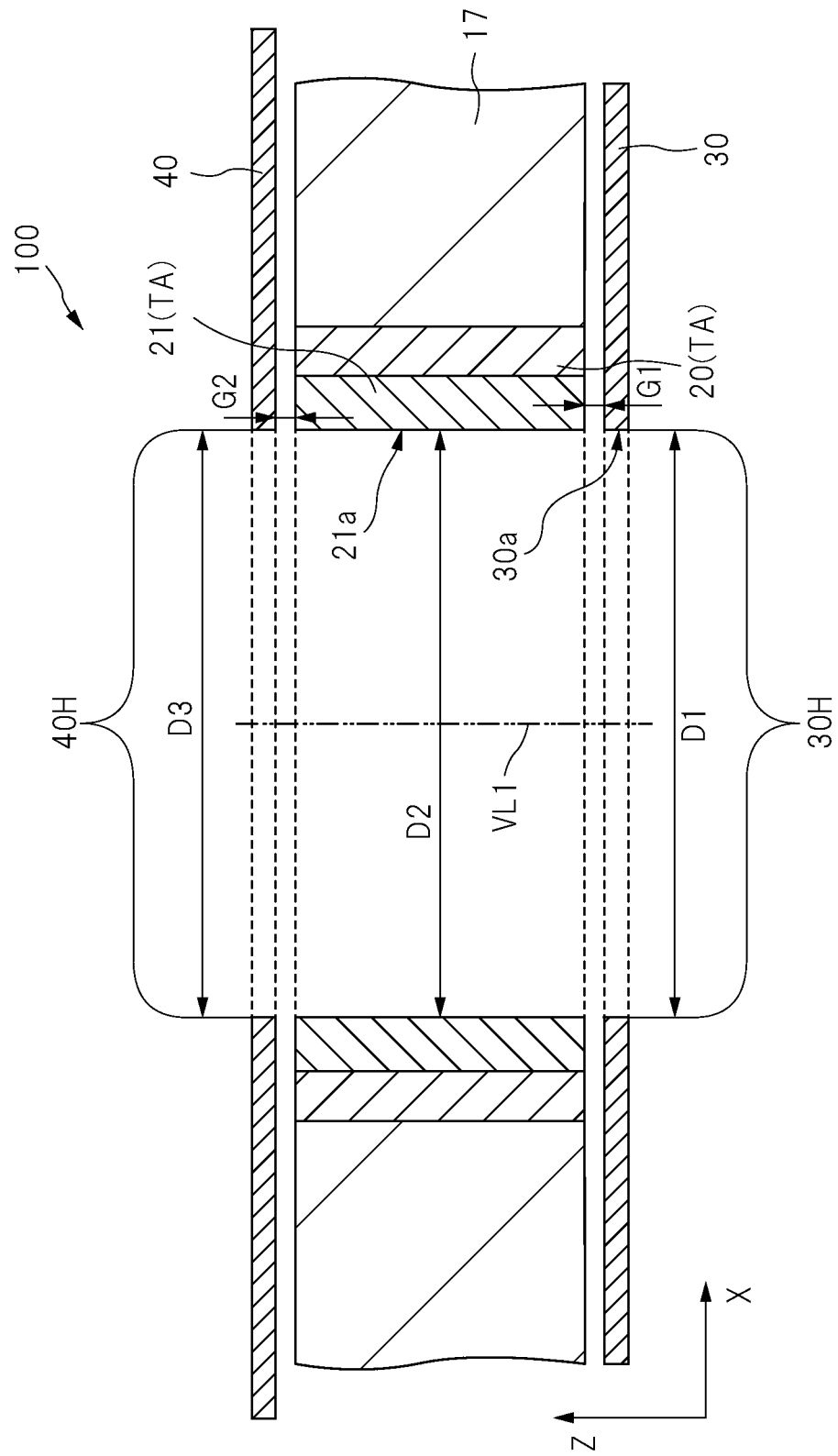
FIG. 6 is a cross-sectional view showing a positional relationship between shield members and a target in a film forming apparatus that is a studied example with respect to FIG. 5.
Figure 7:
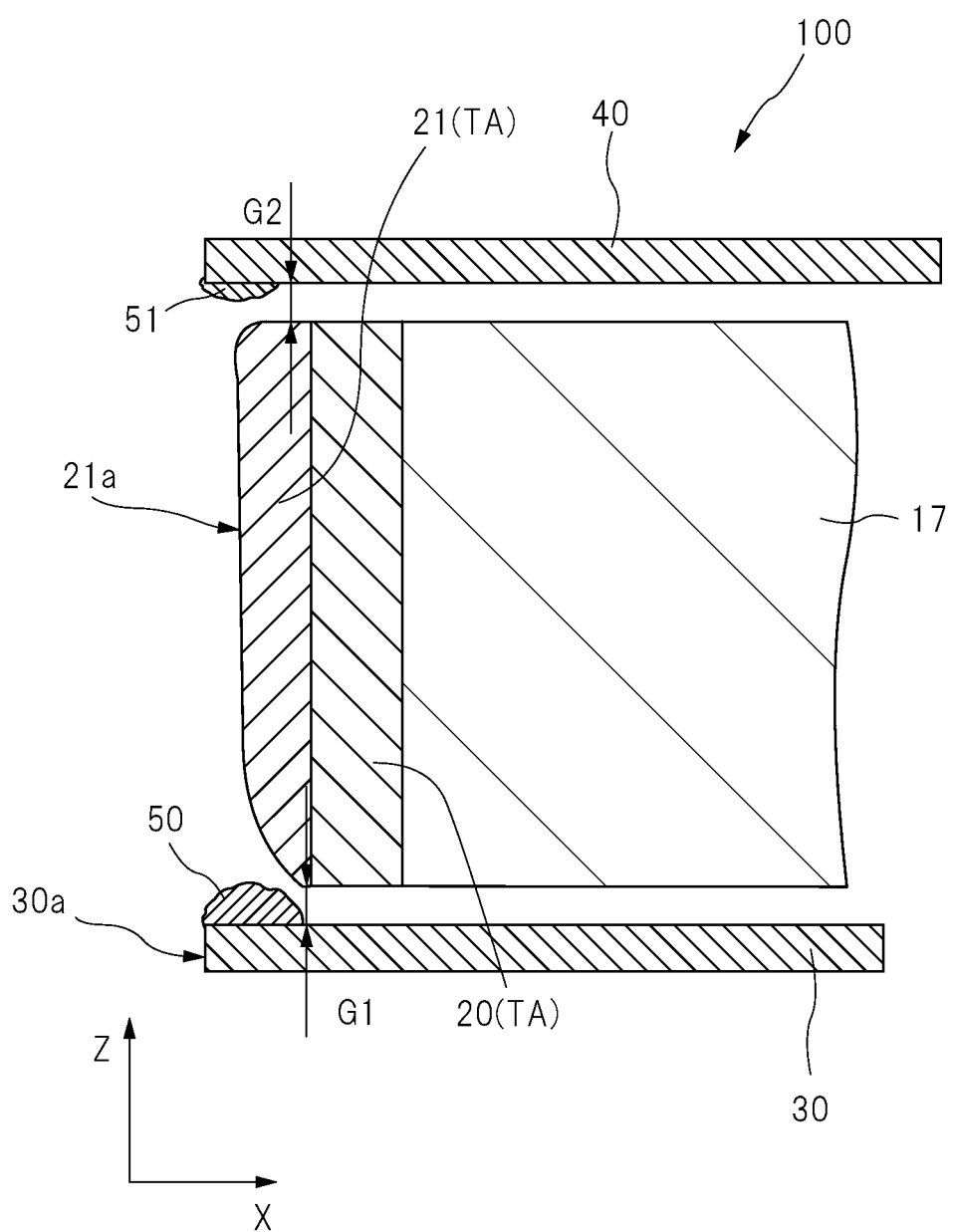
FIG. 7 is an enlarged cross-sectional view showing a state where a target member is sputtered in a part of the target and the shield members shown in FIG. 6.

According to the studies by the inventor of this application, it has been found that another problem occurs when the inner diameter D1 of the opening 30H of the shield member 30 is the same as the inner diameter D2 of the cylindrical target member 21. Hereinafter, a film forming apparatus 100 shown in FIG. 6 will be described as a studied example with respect to FIG. 5. FIG. 6 is a cross-sectional view showing a positional relationship between shield members and a target in a film forming apparatus that is a studied example with respect to FIG. 5. FIG. 7 is an enlarged cross-sectional view showing a state where a target member is sputtered in a part of the target and the shield members shown in FIG. 6. Note that the inner diameter D2 of the target member 21 described in this specification means the inner diameter D2 of the target member 21 in a brand-new state before the plasma irradiation process unless otherwise specified particularly. Since the thickness of the target member 21 gradually decreases as the ions of the plasma collide with the target member 21, the value of the inner diameter D2 also changes. Therefore, in this specification, the value of the inner diameter D2 of the brand-new target member 21 is used as an index in principle.

The film forming apparatus 100 shown in FIG. 6 differs from the film forming apparatus 100 shown in FIG. 5 in that the inner diameter D2 of the target member 21 and the inner diameter D1 of the shield member 30 are the same. The others are the same as those of the film forming apparatus 1 shown in FIG. 5. Each of the target member 21 and the shield member 30 is arranged around the axis VL1 as a central axis. Therefore, an inner wall surface 21a of the target member 21 and an inner wall surface 30a of the shield member 30 are arranged to be flush with each other in the Z direction (in other words, arranged in the same plane). In such a configuration, by setting the value of the separation distance G1 to 5 mm or less, it is possible to suppress the collision of plasma ions with the backing tube 20. In addition, since the entire target member 21 overlaps the shield member 30 in the Z direction, it is possible to suppress the high frequency voltage supplied to the target TA from diffusing around the target member 21.

However, according to the studies by the inventor of this application, it has been found that the film forming apparatus 100 has the following problems caused by a deposit 50 (see FIG. 7) deposited on the shield member 30. For example, when the target member 21 is made of a conductive material such as metal, the deposit 50 has conductive properties. When the deposit 50 grows and the distance between the target member 21 or the backing tube 20 and the deposit 50 becomes closer, the bias voltage generated during the discharge of the target member 21 and the power supplied from the power source cause an abnormal discharge between the shield member 30 and the deposit 50, with the result that the film formation becomes unstable in some cases. Even if the deposit 50 is made of an insulating material or made of a semi-conductive material, the deposit 50 becomes the cause of the abnormal discharge when charge is accumulated in the grown deposit 50. Moreover, if the deposit 50 grows further and the target member 21 or the backing tube 20 and the deposit 50 come into contact with each other, the target TA and the shield member 30 may be short-circuited. In order to prevent the occurrence of unstable film formation and the short-circuit of the shield member 30, it is necessary to stop the film forming process and replace the shield member 30 when the deposit 50 has grown to some extent. As a result, the efficiency of the film forming process is lowered. Note that the deposits 50 and 51 shown in FIG. 7 are substances formed by a part of the target particles adhering to the shield members 30 and 40, respectively. Therefore, the deposits 50 and 51 grow when the film forming process is performed.

Figure 8:
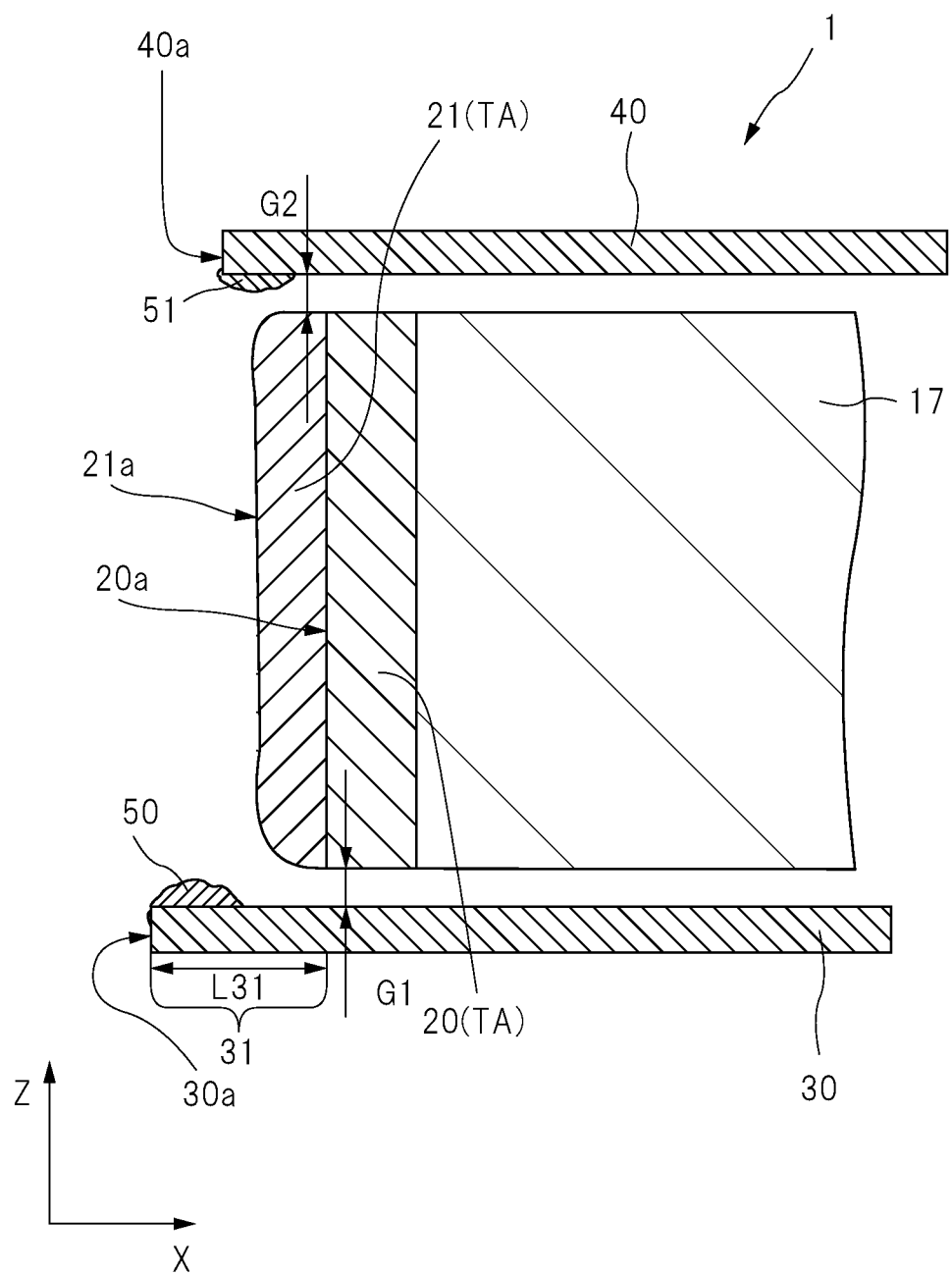
FIG. 8 is an enlarged cross-sectional view showing a state where a target member is sputtered in a part of the target and the shield members shown in FIG. 5.

Therefore, the inventor of this application studied a method of reducing the growth rate of the deposit 50 and a method of preventing the occurrence of unstable film formation and the short-circuit even if the deposit grew, as a method of improving the efficiency of the film forming process. FIG. 8 is an enlarged cross-sectional view showing a state where the target member is sputtered in a part of the target and the shield members shown in FIG. 5.

In the case of the film forming apparatus 1 shown in FIG. 5, the inner diameter D1 of the opening 30H of the shield member 30 is smaller than the inner diameter D2 of the cylindrical target member 21 (inner diameter D2 of the target member 21 in a brand-new state before performing the film forming process as described above). With this configuration, it is possible to suppress the increase of plasma density near the target TA on the side of the shield member 30.

More specifically, the cylindrical target TA is arranged between the plasma generation unit 13 and the film formation object SUB as described with reference to FIG. 1. In this case, the plasma density near the target TA on the side of the plasma generation unit 13 is higher than the plasma density near the target TA on the side of the film formation object SUB. In other words, the plasma density near the target TA on the side of the film formation object SUB is lower than the plasma density near the target TA on the side of the plasma generation unit 13. When there is the difference in the distribution of the plasma density in the vicinity of the target TA in this way, the frequency of the sputtering phenomenon by argon ions increases in the part having relatively high plasma density.

In the case of the film forming apparatus shown in FIG. 7, since the plasma density distribution in the Z direction near the target member 21 is higher on the side of the shield member 30 than on the side of the shield member 40, the frequency of the sputtering phenomenon is higher near the target member 21 on the side of the shield member 30 than near the target member 21 on the side of the shield member 40. As a result, when comparing the degree of consumption of the target member 21, the consumption of the target member 21 becomes larger in the target TA on the side of the shield member 30 than in the target TA on the side of the shield member 40.

Since the deposits 50 and 51 are made of target particles ejected by the sputtering of the target member 21, the deposit 50 formed on the shield member 30 having a relatively higher frequency of the sputtering phenomenon has a growth rate higher than that of the deposit 51 formed on the shield member 40.

In the case of the film forming apparatus 1 shown in FIG. 8, as can be seen by the comparison with FIG. 7, the inner diameter of the ring-shaped shield member 30 is small, and thus the inner wall surface 30a of the shield member 30 protrudes inward than the inner wall surface 21a of the target member 21. In other words, the target member 21 is covered with an eaves portion (visor portion) 31 inside the shield member 30 in the Z direction. Since plasma ions reach the target member 21 via the inner opening of the shield member 30, the increase of plasma density near the target member 21 can be suppressed in the vicinity of the shield member 30 when the shield member 30 has the eaves portion 31.

As a result, as shown in FIG. 8, it is possible to prevent the part of the target member 21 on the side of the shield member 30 from being consumed faster than the other parts. Consequently, since it is possible to decrease the growth rate of the deposit 50, the replacement frequency of the shield member 30 can be reduced.

Also, the deposit 50 is mainly formed near the boundary between the shield member 30 and the opening 30H (see FIG. 5). Accordingly, by increasing a protruding length L31 of the eaves portion 31 in the X direction orthogonal to the Z direction as shown in FIG. 8, the separation distance between the target member 21 and the deposit 50 is less likely to be reduced even if the deposit 50 grows. Therefore, it is possible to prevent the occurrence of unstable film formation by application to the target member 21 or the short-circuit between the target member 21 and the shield member 30. In other words, it is possible to use the shield member 30 without replacing it until the target member 21 is consumed while suppressing the occurrence of unstable film formation and the short-circuit of the shield member 30. In still other words, the sputtering can be stabilized even when the deposit 50 is formed.

Note that the protruding length L31 of the eaves portion 31 in the X direction orthogonal to the Z direction is defined as follows. That is, a surface of the backing tube 20 facing the target member 21 is defined as a target holding surface 20*a*. At this time, a position where an extended surface of the target holding surface 20*a* and the shield member 30 intersect is defined as a reference position, and the distance from the reference position to the inner wall surface 30*a* of the shield member 30 is defined as the length L31. According to this definition, the length L31 is at least larger than the thickness of the target member 21 in a brand-new state.

By the way, according to the studies by the inventor of this application, it has been found that the growth rate of the deposit 50 can be reduced and the decrease of the occurrence frequency of the sputtering can be suppressed by adjusting the inner diameter D2 of the shield member 30 shown in FIG. 5. As to the preferable range of the inner diameter D1 of the shield member 30 based on the inner diameter D2 of the target member 21 shown in FIG. 5, it is possible to suppress the decrease of the occurrence frequency of the sputtering if the inner diameter D1 is 90% or more of the inner diameter D2. On the other hand, from the viewpoint of suppressing the growth of the deposit 50 by the effect of the eaves portion 31, the inner diameter D1 is preferably 99% or less of the inner diameter D2. Further, from the viewpoint of preventing the contact between the grown deposit 50 and the target member 21, the inner diameter D1 is preferably 96% or less of the inner diameter D2.

In the example shown in FIG. 8, each of the separation distances G1 and G2 is, for example, 3 mm. The thickness of the target member 21 in a brand-new state (distance from an outer wall surface facing the backing tube 20 to the inner wall surface 21*a*) is, for example, 3 mm. The inner diameter D2 (see FIG. 5) of the target member 21 is, for example, 120 mm. The inner diameter D1 (see FIG. 5) of the shield member 30 is 114 mm. In this case, the inner diameter D1 is 96% of the inner diameter D2. The protruding length L31 of the eaves portion 31 in the X direction is 3.0 mm. The thickness (length in the Z direction) of the shield member 30 is, for example, 2 mm.

Also, the deposit 51 formed on the shield member 40 shown in FIG. 5 is smaller than the deposit 50. Therefore, the inner wall surface 21*a* of the target member 21 and an inner wall surface 40*a* of the shield member 40 are arranged to be flush with each other in the Z direction (in other words, arranged in the same plane). Therefore, when the inner diameter D1 of the shield member 30 and the inner diameter D3 of the shield member 40 are compared, they can be expressed as follows. That is, the inner diameter D1 of the shield member 30 is smaller than the inner diameter D3 of the shield member 40.

Although not shown, there is an embodiment in which the inner diameter D3 of the shield member 40 is smaller than the inner diameter D2 of the target member 21 as a modification with respect to FIG. 5. In the case of this modification, it is possible to suppress the occurrence of unstable high frequency voltage due to the influence of the deposit 51. However, since the deposit 51 is less likely to grow compared with the deposit 50 as described above, the probability that the deposit 51 grows to the extent that the high frequency voltage becomes unstable is low even with the configuration shown in FIG. 5. On the other hand, from the viewpoint of efficiently carrying the target particles ejected from the target member 21 to the film formation object SUB (see FIG. 1), it is preferable that the opening 40H is large. The inner diameter D1 of the shield member 30 smaller than the inner diameter D3 of the shield member 40 as shown in FIG. 8 is preferable in that the target particles can efficiently reach the film formation object SUB.

<Modification>

Figure 9:
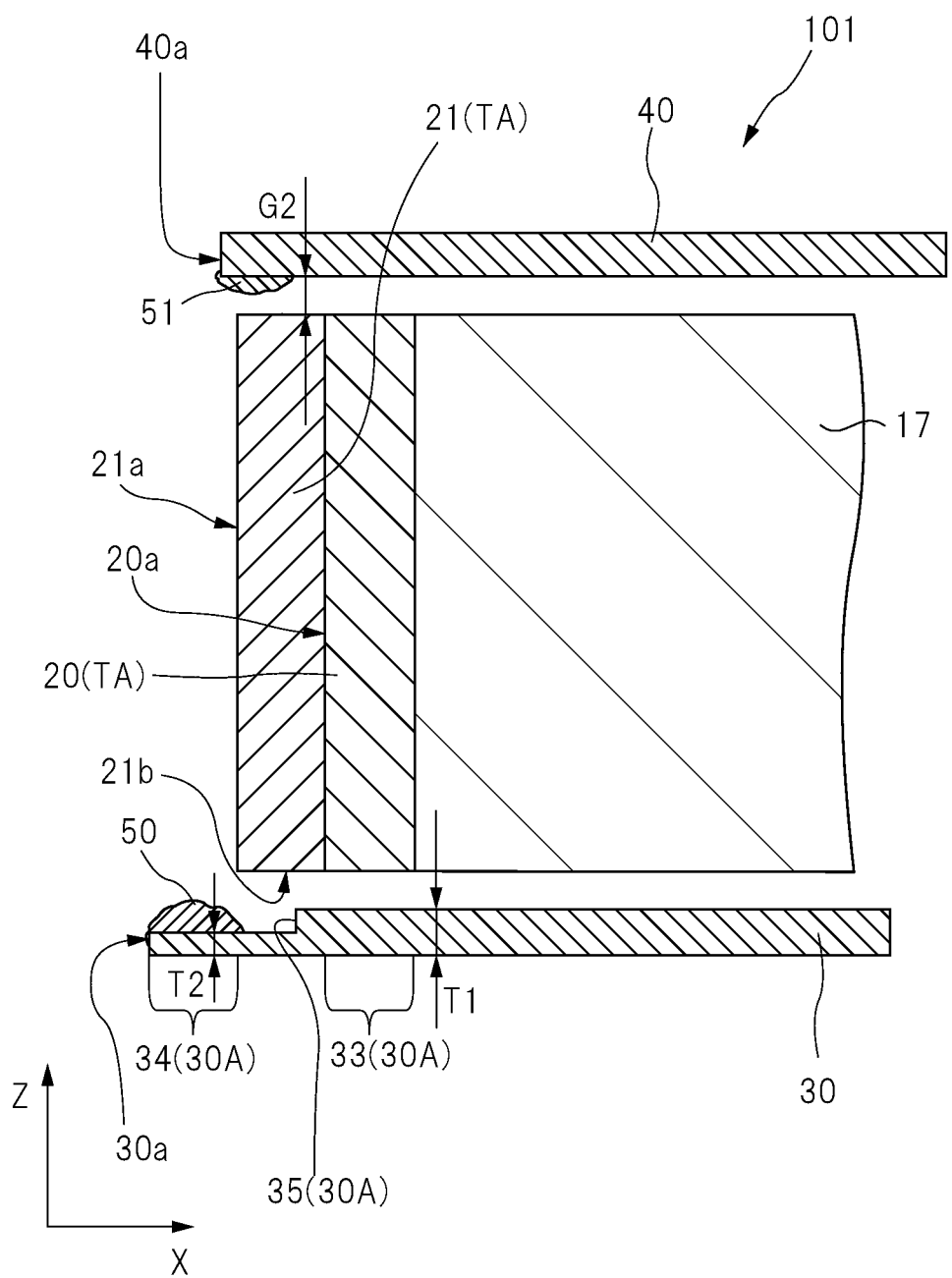
FIG. 9 is an enlarged cross-sectional view showing a modification with respect to the film forming apparatus shown in FIG. 8.

Next, a modification with respect to the film forming apparatus shown in FIG. 5 and FIG. 8 will be described. FIG. 9 is an enlarged cross-sectional view showing a modification with respect to the film forming apparatus shown in FIG. 8. A film forming apparatus 101 shown in FIG. 9 is the same as the film forming apparatus 1 shown in FIG. 1 except for the differences described below. In the following, the differences from the film forming apparatus 1 will be described, and redundant description will be omitted in principle. Also, a shield member 30A of the film forming apparatus 101 has a ring shape like the shield member 30 shown in FIG. 4. The ring-shaped shield member 30A has the structure similar to that of the enlarged cross-section shown in FIG. 9 over the entire circumference. Further, unlike FIG. 8, the target member 21 in a brand-new state before being consumed is illustrated in FIG. 9 in order to clarify the positional relationship between the target member 21 in a brand-new state and a portion 34.

The film forming apparatus 101 shown in FIG. 9 differs from the film forming apparatus 1 shown in FIG. 8 in the following points. That is, the shield member 30A of the film forming apparatus 101 has a portion (first portion) 33 overlapping the backing tube 20 of the target TA in the Z direction and a portion (second portion) 34 not overlapping the target TA in the Z direction. Note that the portion 34 is a portion that does not overlap the target TA even if the target member 21 is in a brand-new state before being consumed. A thickness T2 of the portion 34 is smaller than a thickness T1 of portion 33. Also, when the surface of the target member 21 facing the shield member 30A is defined as a reference surface 21*b*, the shortest distance from the portion 34 to the reference surface 21*b* is larger than the shortest distance from the portion 33 to the reference surface 21*b*. In other words, in the portion 34 that does not overlap the target TA, the surface facing the target TA is shaved and thinned.

When thinning the portion 34 by shaving the surface facing the target TA, the space between the portion 34 and the target member 21 can be increased. Since the deposit 50 is formed on the portion 34, the distance between the deposit 50 and the target member 21 can be increased as the thickness of the portion 34 is reduced.

In the case of this modification, it is possible to secure the separation distance between the deposit 50 and the target member 21 in the Z direction. Therefore, even if the length L31 is shortened compared with the case of the film forming apparatus 1 described with reference to FIG. 8, it is possible to suppress the occurrence of unstable high frequency voltage or the short-circuit between the shield member 30A and the target member 21.

The thickness T2 of the portion 34 needs to be thick enough to prevent the deformation of the portion 34, but it is preferably as thin as possible. For example, in the example shown in FIG. 9, the thickness T1 is 2 mm and the thickness T2 is 1 mm.

In the case of the film forming apparatus 101, the portion 34 has a uniform thickness. Namely, the shield member 30A has a stepped portion 35 between the portion 33 and the portion 34. The thickness of the portion outside the stepped portion 35 (on the outer peripheral side of the shield member 30A) is equal to the thickness of the portion 33, and the thickness of the portion inside the stepped portion 35 (on the side of the opening of the shield member 30A) is equal to the thickness of portion 34. In this way, when the thickness T2 of the portion 34 is uniform, the separation distance between the target member 21 and the deposit 50 can be ensured regardless of the position of the deposit 50 formed on the portion 34.

Further, as shown in FIG. 9, the stepped portion 35 overlaps the target member 21 in the Z direction. As a modification with respect to FIG. 9, the position of the stepped portion 35 may be a position overlapping the backing tube 20 or a position overlapping the fixing unit 17. However, considering the function of preventing the collision of ions with the backing tube 20 among the functions of the shield member 30A, it is preferable that the separation distance between the backing tube 20 and the shield member 30A is short. When the stepped portion 35 is arranged at a position overlapping the target member 21, the separation distance between the backing tube 20 and the shield member 30A can be reduced, and the separation distance between the portion 34 and the target member 21 can be increased.

Figure 10:
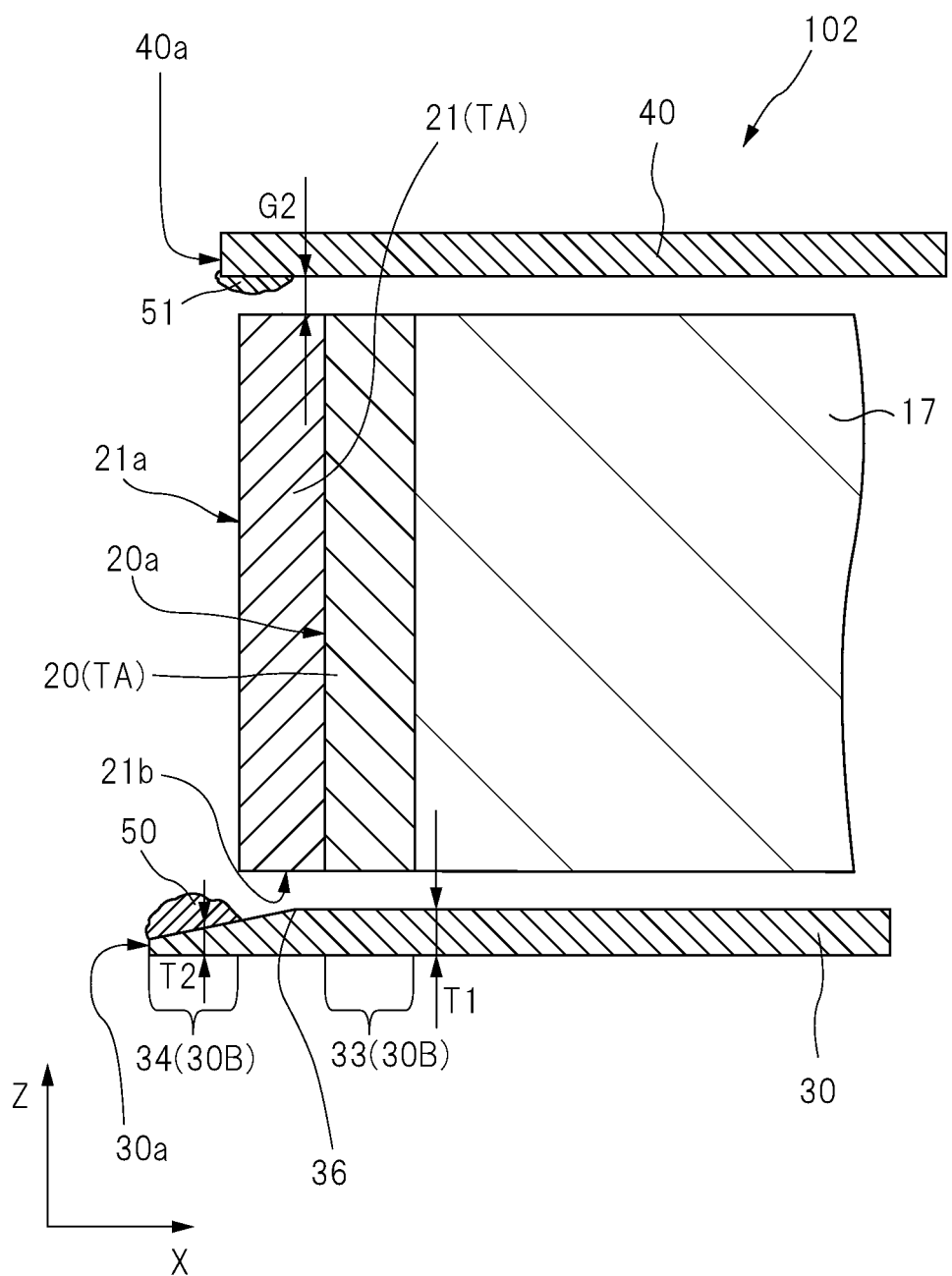
FIG. 10 is an enlarged cross-sectional view showing a modification with respect to the film forming apparatus shown in FIG. 9.

FIG. 10 is an enlarged cross-sectional view showing another modification with respect to FIG. 9. Note that a film forming apparatus 102 shown in FIG. 10 is the same as the film forming apparatus 101 described with reference to FIG. 9 except for the differences described below. In the following, the differences from the film forming apparatus 101 will be described, and redundant description will be omitted in principle. Also, a shield member 30B of the film forming apparatus 102 has a ring shape like the shield member 30 shown in FIG. 4. The ring-shaped shield member 30B has the structure similar to that of the enlarged cross-section shown in FIG. 10 over the entire circumference. Further, unlike FIG. 8, the target member 21 in a brand-new state before being consumed is illustrated in FIG. 10 in order to clarify the positional relationship between the target member 21 in a brand-new state and a portion 34.

The film forming apparatus 102 shown in FIG. 10 differs from the film forming apparatus 101 shown in FIG. 9 in that the surface of the portion 34 facing the target TA is an inclined surface inclined with respect to the X direction orthogonal to the Z direction. In the case of the shield member 30B of the film forming apparatus 102, the stepped portion 35 shown in FIG. 9 does not exist. Further, in the case of the shield member 30B, the thickness T2 of the portion 34 becomes smaller as approaching an inner tip of the shield member 30B. However, as shown in FIG. 10, a starting point 36 of the inclined surface is located at a position overlapping the target member 21. Moreover, the inclination angle of the inclined surface with respect to the X direction is uniform. Therefore, even at the position where the thickness T2 of the portion 34 is the largest, the thickness T2 is smaller than the thickness T1 of the portion 33.

In the case of the shield member 30B, the strength of the portion 34 can be improved compared with the shield member 30A shown in FIG. 9, and thus the thickness of the tip portion (the portion close to the opening 30H shown in FIG. 5) can be made smaller than that of the shield member 30A. The shield member 30B shown in FIG. 10 is more advantageous than the shield member 30A shown in FIG. 9 when the deposit 50 is formed particularly thickly at the tip portion of the shield member 30B.

In the foregoing, the invention made by the inventor of this application has been specifically described based on the embodiments, but it is needless to say that the present invention is not limited to the embodiments described above and can be variously modified within the range not departing from the gist thereof.

The invention claimed is:

1. A film forming apparatus comprising:
    a workpiece holding unit configured to hold a film formation object;
    a plasma generation unit configured to generate plasma;
    a target provided between the workpiece holding unit and the plasma generation unit;
    a ring-shaped first shield member provided between the target and the plasma generation unit; and
    a ring-shaped second shield member provided between the target and the workpiece holding unit,
    wherein the target includes:
        a cylindrical target member; and
        a supporting member arranged around the target member and configured to support the target member,
    wherein each of the first shield member, the second shield member, and the target member is stacked in a first direction around a first axis as a central axis extending in the first direction,
    wherein each of the first shield member, the target member, and the second shield member is arranged so as to be separated from each other in the first direction,
    wherein an inner diameter of the first shield member is smaller than an inner diameter of the target member,
    wherein the first shield member has a first portion overlapping the supporting member of the target in the first direction and a second portion not overlapping the target in the first direction,
    wherein a thickness of the second portion is smaller than a thickness of the first portion, and
    wherein, when a surface of the target member including a surface facing the first shield member is defined as a reference surface, a shortest distance from the second portion to the reference surface is larger than a shortest distance from the first portion to the reference surface.

2. The film forming apparatus according to claim 1, wherein the inner diameter of the first shield member is smaller than an inner diameter of the second shield member.

3. The film forming apparatus according to claim 1, wherein the first shield member has a stepped portion between the first portion and the second portion,
    wherein a thickness of a portion outside the stepped portion is equal to the thickness of the first portion, and
    wherein a thickness of a portion inside the stepped portion is equal to the thickness of the second portion.

4. The film forming apparatus according to claim 3, wherein the stepped portion overlaps the target member in the first direction.

5. The film forming apparatus according to claim 1,
wherein a surface of the second portion facing the target is an inclined surface inclined with respect to a second direction orthogonal to the first direction.

6. The film forming apparatus according to claim 1,
wherein the inner diameter of the first shield member is 90% or more of the inner diameter of the target member.

7. The film forming apparatus according to claim 1,
wherein the inner diameter of the first shield member is 99% or less of the inner diameter of the target member.

* * * * *